(12) United States Patent
Bansal et al.

(10) Patent No.: US 11,293,099 B2
(45) Date of Patent: *Apr. 5, 2022

(54) SHOWERHEAD ASSEMBLY WITH MULTIPLE FLUID DELIVERY ZONES

(71) Applicant: Applied Materials, Inc., Santa Clara, CA (US)

(72) Inventors: Amit Kumar Bansal, Milpitas, CA (US); Juan Carlos Rocha-Alvarez, San Carlos, CA (US); Sanjeev Baluja, Campbell, CA (US); Sam H. Kim, San Ramon, CA (US); Tuan Anh Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/867,307

(22) Filed: May 5, 2020

(65) Prior Publication Data

US 2020/0263301 A1 Aug. 20, 2020

Related U.S. Application Data

(62) Division of application No. 16/192,228, filed on Nov. 15, 2018, now Pat. No. 10,669,629, which is a
(Continued)

(51) Int. Cl.
*C23C 16/455* (2006.01)
(52) U.S. Cl.
CPC .. *C23C 16/45565* (2013.01); *C23C 16/45574* (2013.01)
(58) Field of Classification Search
USPC ............... 118/723 R, 723 E, 715; 239/548; 156/345.34, 345.46; 216/67
See application file for complete search history.

(56) References Cited

U.S. PATENT DOCUMENTS 6,132,512 A 10/2000 Horie et al.
6,415,736 B1 7/2002 Hao et al.
(Continued)

FOREIGN PATENT DOCUMENTS

CN 1607889 A 4/2005
CN 1865496 A 11/2006
(Continued)

OTHER PUBLICATIONS

International Search Report and the Written Opinion for International Application No. PCT/US2015/026687 dated Jun. 30, 2015, 9 pages.
(Continued)

*Primary Examiner* — Yewebdar T Tadesse
(74) *Attorney, Agent, or Firm* — Patterson + Sheridan, LLP (57) ABSTRACT

The present disclosure relates to a semiconductor processing apparatus. The processing chamber includes a chamber body and lid defining an interior volume, a substrate support disposed in the interior volume and a showerhead assembly disposed between the lid and the substrate support. The showerhead assembly includes a faceplate configured to deliver a process gas to a processing region defined between the showerhead assembly and the substrate support and an underplate positioned above the faceplate, defining a first plenum between the lid and the underplate, the having multiple zones, wherein each zone has a plurality of openings that are configured to pass an amount of inert gas from the first plenum into a second plenum defined between the faceplate and the underplate, in fluid communication with the plurality of openings of each zone such that the inert gas mixes with the process gas before exiting the showerhead assembly.

13 Claims, 4 Drawing Sheets

Related U.S. Application Data division of application No. 14/965,061, filed on Dec. 10, 2015, now Pat. No. 10,233,543.

(60) Provisional application No. 62/239,547, filed on Oct. 9, 2015.

(56) References Cited

U.S. PATENT DOCUMENTS

| | | | |
|---|---|---|---|
| 6,502,530 | B1 | 1/2003 | Turlot et al. |
| 10,233,543 | B2 * | 3/2019 | Bansal ............... C23C 16/45574 |
| 2001/0027026 | A1 | 10/2001 | Dhindsa et al. |
| 2003/0019580 | A1 | 1/2003 | Strang |
| 2003/0070761 | A1 | 4/2003 | Turlot et al. |
| 2005/0011447 | A1 | 1/2005 | Fink |
| 2006/0137607 | A1 | 6/2006 | Seo et al. |
| 2007/0020943 | A1 | 1/2007 | Kim et al. |
| 2008/0236495 | A1 | 10/2008 | Tompa |
| 2009/0000743 | A1 | 1/2009 | Iizuka |
| 2009/0061640 | A1 * | 3/2009 | Wong ................ C23C 16/45523 438/734 |
| 2009/0155997 | A1 | 6/2009 | Shinriki et al. |
| 2009/0169744 | A1 | 7/2009 | Byun et al. |
| 2009/0178763 | A1 | 7/2009 | Carducci et al. |
| 2010/0008656 | A1 | 1/2010 | Sorabji et al. |
| 2010/0151687 | A1 | 6/2010 | Dhindsa et al. |
| 2011/0156734 | A1 | 6/2011 | Berry et al. |
| 2013/0109159 | A1 | 5/2013 | Carlson |
| 2014/0061324 | A1 | 3/2014 | Mohn et al. |
| 2015/0329966 | A1 | 11/2015 | Shah et al. |

FOREIGN PATENT DOCUMENTS

| | | | |
|---|---|---|---|
| CN | 101000946 | A | 7/2007 |
| CN | 101499407 | A | 8/2009 |
| CN | 101797530 | A | 8/2010 |
| CN | 102234791 | A | 11/2011 |
| CN | 102522324 | A | 6/2012 |
| CN | 103219216 | A | 7/2013 |
| CN | 103352201 | A | 10/2013 |
| CN | 104813440 | A | 7/2015 |
| CN | 207320068 | U | 5/2018 |
| JP | H05175135 | A | 7/1993 |
| JP | 2003257937 | A | 9/2003 |
| JP | 2004342704 | A | 12/2004 |
| JP | 2007027490 | A | 2/2007 |
| KR | 20070021637 | A | 2/2007 |
| KR | 20080015754 | A | 2/2008 |
| KR | 101060774 | B1 | 8/2011 |
| WO | 2008123605 | A1 | 10/2008 |
| WO | 2014052301 | A1 | 4/2014 |
| WO | 2015102256 | A1 | 7/2015 |

OTHER PUBLICATIONS

Office Action issued in corresponding Chinese Patent Application No. 201710624010.6 dated Jul. 31, 2018, 10 pages.

Search Report Issued in corresponding Chinese Patent Application No. 2017106240106 dated Jul. 21, 2018, 2 pages.

Office Action issued in corresponding Chinese Patent Application No. 201710624010.6 dated Jan. 28, 2019, 3 pages.

Search Report issued in corresponding Chinese Patent Application No. 201710624010.6 dated Jan. 13, 2019, 4 pages.

International Search Report and the Written Opinion for International Application No. PCT/US2013/061375 dated Jan. 13, 2014, 10 pages.

Office Action issued in corresponding Taiwanese Patent Application No. 105132033 dated Jul. 17, 2019, 12 pages.

Notice of Allowance and Search Report issued in corresponding Chinese Patent Application No. 201710624010.6 dated Jun. 25, 2019, 8 pages.

Chinese Office Action dated Jul. 12, 2021 for Application No. 201610875496.6.

Taiwan Office Action dated Aug. 23, 2021 for Application No. 109139455.

Chinese Office Action dated Dec. 13, 2021 for Application No. 201610875496.6.

* cited by examiner

SHOWERHEAD ASSEMBLY WITH MULTIPLE FLUID DELIVERY ZONES

CROSS-REFERENCE TO RELATED APPLICATIONS

This application is a divisional application of U.S. patent application Ser. No. 16/192,228, filed Nov. 15, 2018, which claims priority from U.S. patent application Ser. No. 14/965,061, filed Dec. 10, 2015 and now issued as U.S. Pat. No. 10,233,543, which claims priority from U.S. Provisional Application Ser. No. 62/239,547, filed Oct. 9, 2015. Each of the aforementioned related patent applications is herein incorporated by reference.

BACKGROUND

Field

Embodiments of the present disclosure generally relate to a showerhead assembly for a semiconductor processing apparatus, and more particularly to a showerhead assembly having multiple zones for independent control of fluid passing through the showerhead assembly.

Description of the Related Art

Reliably producing sub-half micron and smaller features is one of the key technology challenges for next generation very large scale integration (VLSI) and ultra large scale integration (ULSI) of semiconductor devices. However, as the limits of circuit technology are pushed, the shrinking dimensions of VLSI and ULSI technology have placed additional demands on processing capabilities. Reliable formation of gate structures on the substrate is helpful to VLSI and ULSI success and to the continued effort to increase circuit density.

As circuit densities increase for next generation devices, the widths of interconnects, such as vias, trenches, contacts, gate structures and other features, as well as the dielectric materials therebetween, decrease to 45 nm and 32 nm dimensions and beyond. In order to enable the fabrication of next generation devices and structures, three dimensional (3D) stacking of features in semiconductor chips is often utilized. In particular, fin field effect transistors (FinFETs) are often utilized to form three dimensional (3D) structures in semiconductor chips. By arranging transistors in three dimensions instead of conventional two dimensions, multiple transistors may be placed in the integrated circuits (ICs) very close to each other. As circuit densities and stacking increase, the ability to selectively deposit subsequent materials on previously deposited materials gains importance. The ability to control fluids delivered to substrates through showerhead assemblies has become increasingly helpful in aiding the successful fabrication of next generation devices.

Thus, there is a need for an improved showerhead assembly.

SUMMARY

The present disclosure relates to a semiconductor processing apparatus. The processing chamber includes a chamber body and lid defining an interior volume, a substrate support disposed in the interior volume and a showerhead assembly disposed between the lid and the substrate support. The showerhead assembly includes a faceplate configured to deliver a process gas to a processing region defined between the showerhead assembly and the substrate support and an underplate positioned above the faceplate, defining a first plenum between the lid and the underplate, the having multiple zones, wherein each zone has a plurality of openings that are configured to pass an amount of inert gas from the first plenum into a second plenum defined between the faceplate and the underplate, in fluid communication with the plurality of openings of each zone such that the inert gas mixes with the process gas before exiting the showerhead assembly.

In another embodiment, a showerhead assembly is disclosed herein. The showerhead assembly comprises a faceplate having a first side and a second side, the faceplate having a plurality of apertures configured to deliver one or more gases from the first side to the second side, an underplate disposed adjacent to the first side of the faceplate, wherein a plenum is defined between the faceplate and the underplate, and a plurality of gas lines formed through the underplate into the plenum, the plurality of gas lines coupled to a gas source, wherein each gas line of the plurality of gas lines is configured to provide a different concentration of the one or more gases to the plenum, and wherein the gas source is configured to dilute the concentration of a first gas of the one or more gases with a second gas of the one or more gases in the plenum using the plurality of gas lines.

In another embodiment, a showerhead assembly is disclosed herein. The showerhead assembly comprises an underplate partitioning multiple zones, wherein each zone has a plurality of apertures that are configured to pass a first gas through the underplate into a first plenum, wherein the first gas mixes with a second gas in the first plenum, a diffuser plate disposed adjacent the underplate, wherein the first plenum is defined between the underplate and the diffuser plate, and wherein the diffuser plate comprises a plurality of apertures configured to pass the first gas mixed with the second gas from the first plenum to a second plenum, and a faceplate having a first side and a second side, the first side of the faceplate being disposed adjacent to the diffuser plate, wherein the second plenum is defined between the diffuser plate and the first side of the faceplate, and wherein the faceplate has a plurality of apertures configured to deliver the first gas mixed with the second gas from the second plenum to the second side.

In another embodiment, a processing chamber is disclosed herein. The processing chamber comprises a chamber body, a substrate support assembly disposed within the chamber body, and a shower head assembly disposed above the substrate support assembly within the chamber body. The shower head assembly comprises an underplate partitioning multiple zones, wherein each zone has a plurality of apertures that are configured to pass a first gas through the underplate into a first plenum, wherein the first gas mixes with a second gas in the first plenum, a diffuser plate disposed adjacent the underplate, wherein the first plenum is defined between the underplate and the diffuser plate, and wherein the diffuser plate comprises a plurality of apertures configured to pass the first gas mixed with the second gas from the first plenum to a second plenum, and a faceplate having a first side and a second side, the first side of the faceplate being disposed adjacent to the diffuser plate, wherein the second plenum is defined between the diffuser plate and the first side of the faceplate, and wherein the faceplate has a plurality of apertures configured to deliver the first gas mixed with the second gas from the second plenum to the second side.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Figure 1:
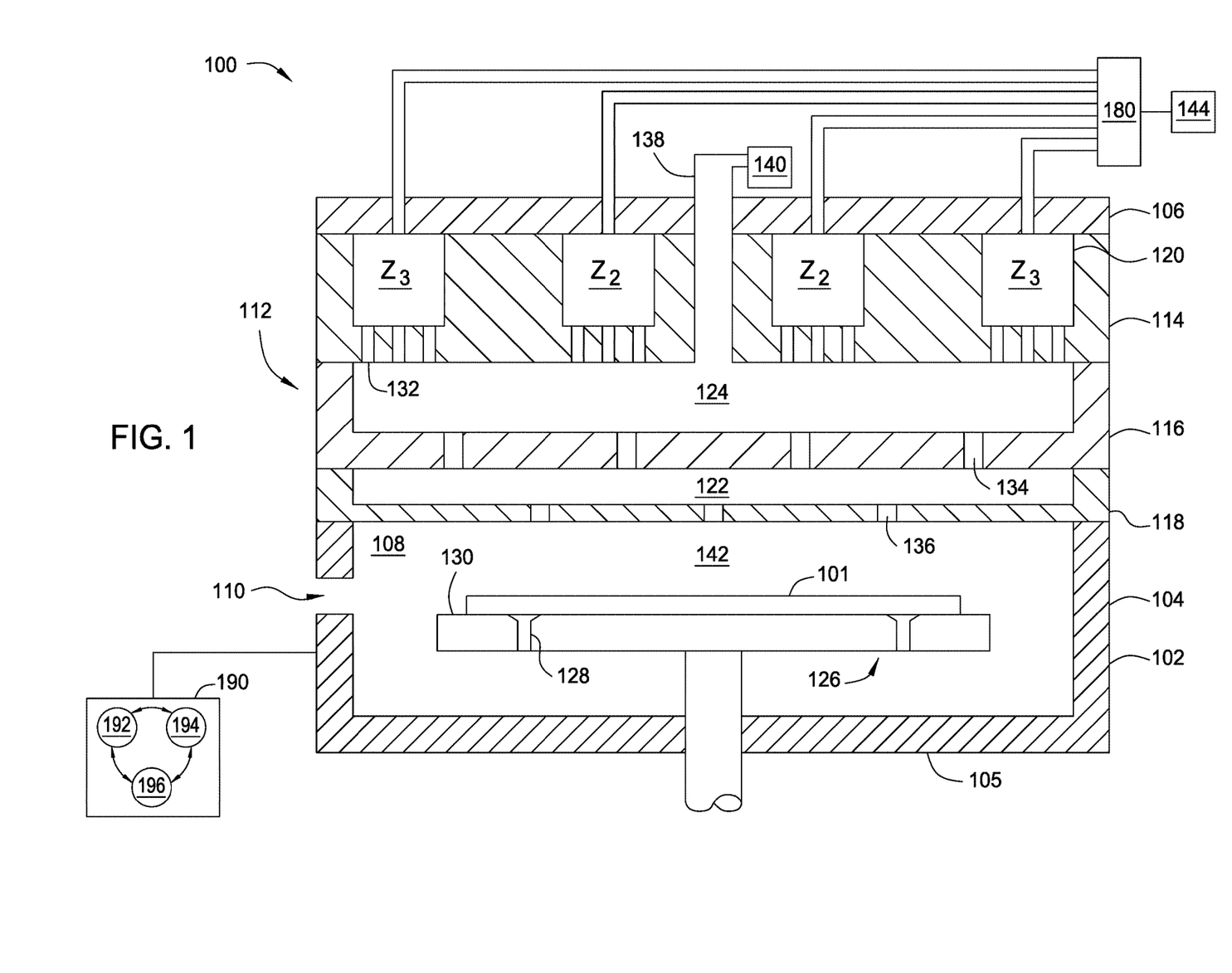
FIG. 1 illustrates a processing chamber having a showerhead assembly, according to one embodiment.

FIG. 1 illustrates a chemical vapor deposition (CVD) processing chamber 100 having a showerhead assembly 112, according to one embodiment. The processing chamber 100 includes a chamber body 102 having sidewalls 104, a bottom 105, and a lid 106. The sidewalls 104 and lid 106 define an interior volume 108. A substrate transfer port 110 may be formed in the sidewall 104 for transferring substrates into and out of the interior volume 108.

A substrate support assembly 126 is disposed within the interior volume 108 of the processing chamber 100 below the showerhead assembly 112. The substrate support assembly 126 is configured to support a substrate 101 during processing. The substrate support assembly 126 may include a plurality of lift pins 128 movably disposed therethrough. The lift pins 128 may be actuated to project from a support surface 130 of the substrate support assembly 126, thereby placing the substrate 101 in a spaced-apart relation to the substrate support assembly 126 to facilitate transfer with a transfer robot (not shown) through the substrate transfer port 110.

The showerhead assembly 112 is disposed in the interior volume 108 and is coupled to the lid 106. The showerhead assembly 112 includes an underplate 114 and a faceplate 118. The underplate 114 is positioned below the lid 106 such that a first plenum 120 is formed between the underplate 114 and the lid 106. In one embodiment, the showerhead assembly 112 further includes a diffuser plate 116 positioned between the underplate 114 and the faceplate 118. The diffuser plate 116 forms a second plenum 124 between the underplate 114 and the diffuser plate 116 and a third plenum 122 between the diffuser plate 116 and the faceplate 118.

The first plenum 120 is partitioned into a plurality of zones by the underplate 114. For example, in the embodiment shown in FIG. 1, the first plenum 120 is partitioned into zone Z2 and zone Z3. The first plenum 120 is configured to receive an inert gas from a gas delivery system 180 coupled to an inert gas source 144. The inert gas may be provided to each zone Z2 and Z3. For example, a greater amount of inert gas may be provided to Z2 compared to that of Z3. In one embodiment, the gas delivery system 180 uses a flow ratio control technique to control the amount of inert gas delivered to zone Z2 relative to zone Z3. In one embodiment, different combinations of pneumatic valves and sized orifices may be used to achieve gas splitting. In another embodiment, using different gas delivery valves, such as piezo and ALD valves, when used in combination can achieve the same gas splitting results to the different zones.

The underplate 114 is configured to provide the inert gas from the first plenum 120 to the second plenum 124. The underplate 114 includes a plurality of apertures 132. The apertures 132 allow for fluid communication between the first plenum 120 and the second plenum 124. The plurality of apertures 132 are positioned beneath the zones Z2 and Z3, and thus, the apertures 132 are grouped into corresponding zones Z2, Z3 in the underplate 114.

The processing chamber 100 further includes a central conduit 138. The central conduit 138 is formed through the lid 106 and opens into the second plenum 124. The central conduit 138 is configured to provide a process gas to the second plenum 124 from the process gas source 140. In the second plenum 124, the process gas supplied by the central conduit 138 mixes with the inert gas provided from the underplate 114. Because the amount of inert gas entering the second plenum 124 through each zone of the underplate 114 is different, the ratio of process gas to inert gas is not uniform across the second plenum 124. Thus, in the second plenum 124 there are three zones (A1, A2, A3) of process gas dilution by the inert gas. A first zone, A1, directly beneath the central conduit 138 in which the process gas is not diluted by the first gas; the second zone A2 beneath Z2 in the first plenum 120; and the third zone A3 beneath Z3 in the first plenum 120. Each zone A1-A3 may include a different ratio of inert gas to the process gas. Creating multiple zones of process gas in the plenum 120 allows for a gradient in the distribution of the process gas exiting the faceplate and delivered to the substrate to improve film deposition properties.

The diffuser plate 116 includes a plurality of apertures 134. The plurality of apertures 134 allows for fluid communication between the second plenum 124 and the third plenum 122. The diffuser plate 116 is configured to disperse the gas mixture provided to the third plenum 122. The third plenum 122 is in fluid communication with a processing region 142 defined between the faceplate 118 and the substrate support assembly 126 through a plurality of apertures 136 formed through the faceplate 118. The apertures allow for fluid communication between the third plenum 122 and the processing region 142.

A controller 190 is coupled to the processing chamber 100. The controller 190 includes a central processing unit (CPU) 192, a memory 194, and support circuits 196. The controller 190 is utilized to control the amount of inert gas supplied to each zone Z2, Z3 of the first plenum 120. Controlling the amount of inert gas to each zone allows for gas distribution uniformity exiting the showerhead assembly 112 to be controlled. The CPU 192 may be of any form of a general purpose computer processor that can be used in an industrial setting. The software routines can be stored in the memory 194, such as random access memory, read only memory, floppy or hard disk drive, or other form of digital storage. The support circuits 196 are conventionally coupled to the CPU 192 and may comprise cache, clock circuits, input/output subsystems, power supplies, and the like. The software routines, when executed by the CPU 192, transform the CPU 192 into a specific purpose computer (controller) 190 that controls the processing chamber 100 such that the processes are performed in accordance with the present disclosure. The software routines may also be stored and/or executed by a second controller (not shown) that is located remotely from the chamber.

Figure 2:
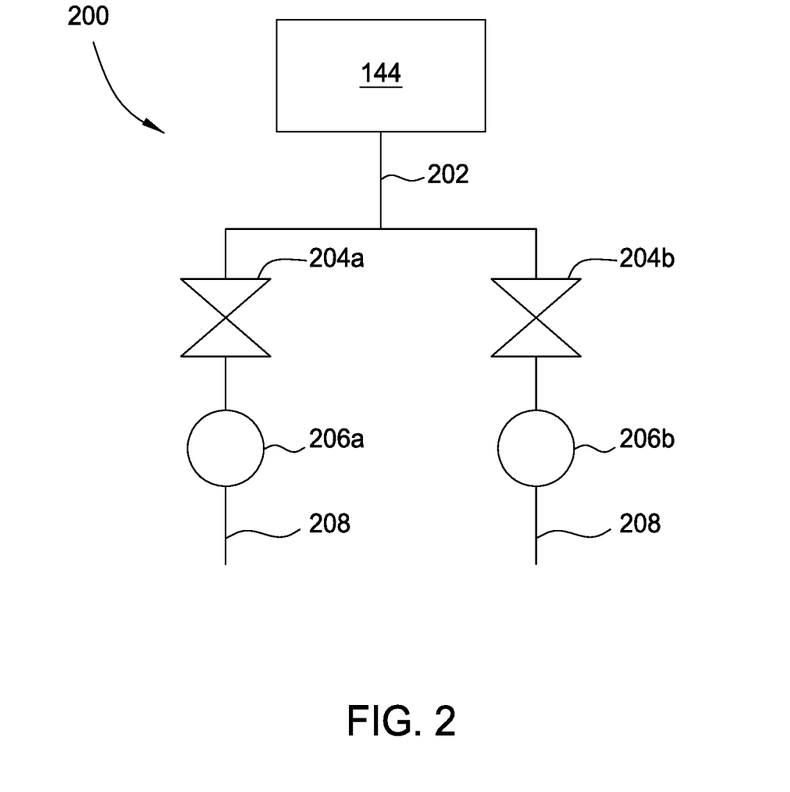
FIG. 2 illustrates a gas delivery system of FIG. 1, according to one embodiment.

FIG. 2 illustrates the gas delivery system 180 according to one embodiment. The gas delivery system 180 includes a flow ratio control device 200 coupled to each zone Z2, Z3 of the first plenum 120. The flow ratio control device 200 includes a supply line 202 coupled to the gas source 144, a plurality of valves 204a, 204b, a plurality of orifices 206a, 206b, and an outlet line 208. The supply line 202 delivers an inert gas to each valve 204a-204b. The valves 204a-204b are independently controlled, and are configured to open and close to control the amount of inert gas supplied to each respective orifice 206a-206b. Each orifice 206a-206b may be sized differently, such that each zone may receive a different amount of gas flow. Additional valves and orifices may be added or subtracted based on the number of zones desired in the first plenum 120.

Figure 3:
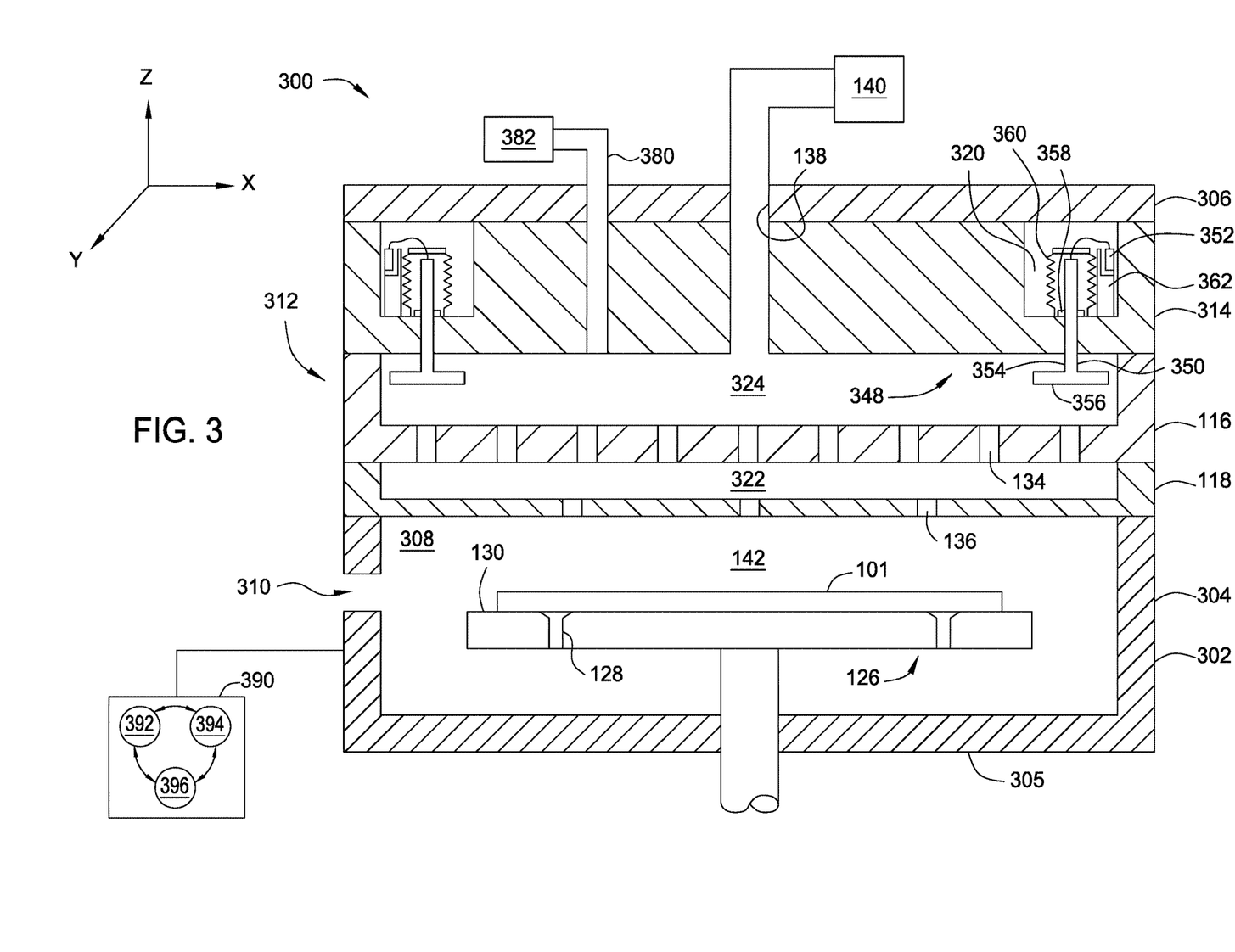
FIG. 3 illustrates a processing chamber having a showerhead assembly, according to one embodiment.

FIG. 3 illustrates a CVD processing chamber 300, according to one embodiment. The processing chamber 300 includes a chamber body 302 having sidewalls 304, a bottom 305, and a lid 306. The sidewalls 304 and lid 306 define an interior volume 308. A substrate transfer port 310 may be formed in the sidewall 304 for transferring substrates into and out of the interior volume 308.

The processing chamber 300 further includes a showerhead assembly 312. The showerhead assembly 312 includes an underplate 314 and the faceplate 118. The underplate 314 is positioned below the lid 306 such that a first plenum 320 is formed between the underplate 314 and the lid 306. In one embodiment, the showerhead assembly 312 further includes the diffuser plate 116 positioned between the underplate 314 and the faceplate 118. The diffuser plate 116 forms a second plenum 324 between the underplate 314 and the diffuser plate 116 and a third plenum 322 between the diffuser plate 116 and the faceplate 118. The central conduit 138 is formed through the lid 306 and opens into the second plenum 324. The central conduit 138 is configured to provide a process gas to the second plenum 324 from the process gas source 140. An inert gas line 380 is formed through the lid 306 and underplate 314 and opens into the second plenum 324. The inert gas line 380 is configured to provide an inert gas to the second plenum 324 from the inert gas source 382, such that the inert gas mixes with the process gas in the second plenum 324.

A movable conductance controller assembly 348 is disposed in the first plenum 320 and extends through the underplate 314 into the second plenum 324. The movable conductance controller assembly 348 is configured to control the conductance through a gap defined between the diffuser plate 116 and the underplate 314 to control the amount of gas flowing through different regions (zones) of the second plenum 324. The movable conductance controller assembly 348 includes a conductance controller 350 and an actuator 352. In one embodiment, the conductance controller 350 may include a shaft 354 and a plate 356. The shaft 354 may extend through the underplate 314 into the second plenum 324 such that the plate 356 is within the second plenum 324. In one embodiment, an o-ring 358 and bellows 360 may be used to maintain isolation between the first plenum 320 and the second plenum 324.

The actuator 352, such as a motor or cylinder, may be coupled to the conductance controller 350. In one embodiment, the motor may be mounted to a z-stage 362 disposed in the first plenum 320. The actuator 352 is configured to move the conductance controller 350 in the z-direction. Raising and lowering the conductance controller 350 controls the amount of flow of the process gas mixture to be distributed to the second plenum 324. For example, a larger gap between the conductance controller 350 and the diffuser plate 116 allows for a greater amount of process gas mixture within the second plenum 324. Conversely, a smaller gap between the conductance controller 350 and the diffuser plate 116 allows for a lesser amount of a process gas mixture within the second plenum 324. Each conductance controller 350 disposed in the first plenum 320 may be controlled independently to define a plurality of zones of process gas mixture in the second plenum 324. The plurality of apertures 134 are positioned beneath the plurality of zones. The apertures 134 are grouped in corresponding zones in the diffuser plate 116. Because the concentration of process gas mixture entering the third plenum 322 through each zone in the diffuser plate 116 is different, the concentration of process gas mixture is not uniform across the third plenum 322. Multiple zones of process gas mixture are defined in the third plenum 322, allowing for a gradient in the distribution of the process gas mixture exiting the faceplate 118 and delivered to the substrate to improve film deposition properties.

A controller 390 is coupled to the processing chamber 300. The controller 390 includes a central processing unit (CPU) 392, a memory 394, and support circuits 396. The controller 390 may be coupled to the actuator 352 to control the conductance controller 350. Controlling the conductance controller 350 allows for a gradient in the distribution of the process gas in the showerhead assembly 312. The CPU 392 may be of any form of a general purpose computer processor that can be used in an industrial setting. The software routines can be stored in the memory 394, such as random access memory, read only memory, floppy or hard disk drive, or other form of digital storage. The support circuits 396 are conventionally coupled to the CPU 392 and may comprise cache, clock circuits, input/output subsystems, power supplies, and the like. The software routines, when executed by the CPU 392, transform the CPU 392 into a specific purpose computer (controller) 390 that controls the processing chamber 300 such that the processes are performed in accordance with the present disclosure. The software routines may also be stored and/or executed by a second controller (not shown) that is located remotely from the chamber.

Figure 4:
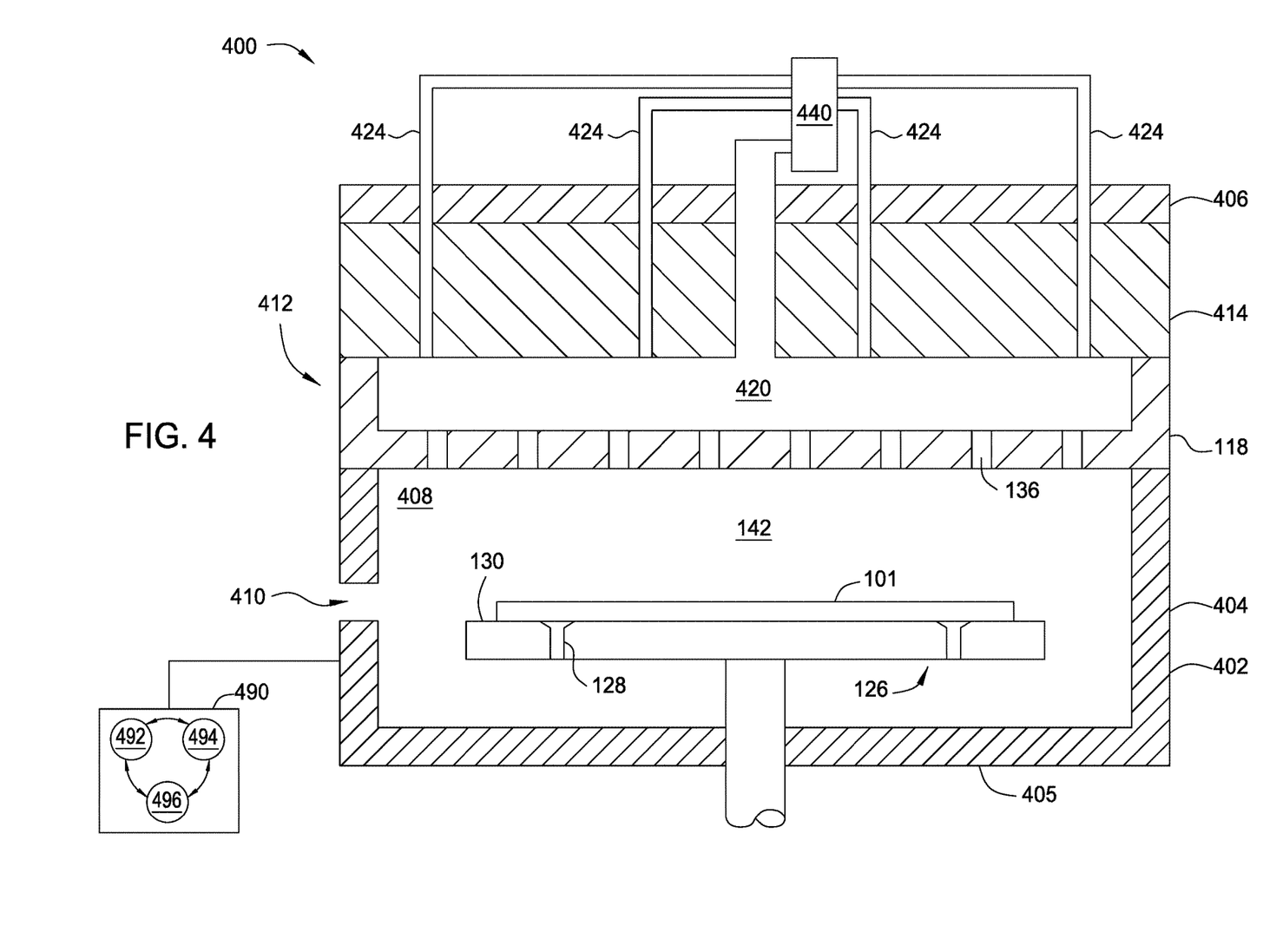
FIG. 4 illustrates a processing chamber having a showerhead assembly, according to one embodiment.

FIG. 4 illustrates a CVD processing chamber 400 according to yet another embodiment. The processing chamber 400 includes a chamber body 402 having sidewalls 404, a bottom 405, and a lid 406. The sidewalls 404 and lid 406 define an interior volume 408. A substrate transfer port 410 may be formed in the sidewall 404 for transferring substrates into and out of the interior volume 408.

The processing chamber 400 further includes a showerhead assembly 412. The showerhead assembly 412 includes an underplate 414 and the faceplate 118. The underplate 414 is positioned below the lid 406 such that a plenum 420 is formed between the underplate 414 and the faceplate 118. A plurality of gas lines 424 coupled to a gas source 440 extend through the lid 406 and underplate 414 to provide process gas to the plenum 420. Each line 424 may be configured to deliver a different concentration of process gas to the plenum 420. For example, multiple zones of process gas may be formed in the plenum 420 by diluting the concentration of process gas with an inert gas in the outer gas lines 424 compared to the concentration of the process gas flowing through the inner gas lines 424. The plurality of apertures 136 are positioned beneath the zones, and thus the apertures 136 are grouped into corresponding zones. Creating multiple zones of process gas concentration in the plenum 420 allows for a gradient in the amount of process gas delivered to the substrate to improve film deposition properties.

A controller 490 is coupled to the processing chamber 400. The controller 490 includes a central processing unit (CPU) 492, a memory 494, and support circuits 496. The controller 490 may be coupled to the gas source 440 to control the concentration of process gas supplied to each gas line 424. Controlling each respective gas line 424 allows for modulation of the gas distribution in the showerhead assembly. The CPU 492 may be of any form of a general purpose computer processor that can be used in an industrial setting. The software routines can be stored in the memory 494, such as random access memory, read only memory, floppy or hard disk drive, or other form of digital storage. The support circuits 496 are conventionally coupled to the CPU 492 and may comprise cache, clock circuits, input/output subsystems, power supplies, and the like. The software routines, when executed by the CPU 492, transform the CPU 492 into a specific purpose computer (controller) 490 that controls the processing chamber 400 such that the processes are performed in accordance with the present disclosure. The software routines may also be stored and/or executed by a second controller (not shown) that is located remotely from the chamber.

While the foregoing is directed to embodiments of the present disclosure, other and further embodiments of the disclosure may be devised without departing from the basic scope thereof, and the scope thereof is determined by the claims that follow.

What is claimed is:

1. A showerhead assembly, comprising:
   an underplate partitioning multiple zones, wherein each zone has a plurality of apertures that are configured to pass a first gas through the underplate into a first plenum, wherein the first gas mixes with a second gas in the first plenum;
   a diffuser plate disposed adjacent the underplate, wherein the first plenum is defined between the underplate and the diffuser plate, and wherein the diffuser plate comprises a plurality of apertures configured to pass the first gas mixed with the second gas from the first plenum to a second plenum; and
   a faceplate having a first side and a second side, the first side of the faceplate being disposed adjacent to the diffuser plate, wherein the second plenum is defined between the diffuser plate and the first side of the faceplate, and wherein the faceplate has a plurality of apertures configured to deliver the first gas mixed with the second gas from the second plenum to the second side.

2. The showerhead assembly of claim 1, further comprising a flow ratio control device coupled to the multiple zones through a plurality of gas lines, the flow ratio device comprising:
   a first gas source coupled to each gas line of the plurality of gas lines, the first gas source configured to provide the first gas to each zone;
   a plurality of valves, each valve being coupled to a gas line of the plurality of gas lines, wherein each valve is configured to open and close a respective gas line of the plurality of gas lines; and
   a plurality of orifices, each orifice being coupled to a gas line of the plurality of gas lines, wherein each orifice is configured to control a flow rate of the first gas through a respective gas line of the plurality of gas lines.

3. The showerhead assembly of claim 2, wherein one or more orifices of the plurality of orifices have different sizes to provide different amounts of gas flow to one or more zones of the multiple zones.

4. The showerhead assembly of claim 1, further comprising:
   a central conduit extending through the underplate to the first plenum, wherein the central conduit is configured to provide the second gas to the first plenum; and
   a second gas source configured to provide the second gas to the first plenum.

5. The showerhead assembly of claim 1, wherein each zone is provided with a different concentration of the first gas.

6. The showerhead assembly of claim 1, wherein the plurality of zones formed in the underplate corresponds to a plurality of zones in the faceplate.

7. A processing chamber, comprising:
   a chamber body;
   a substrate support assembly disposed within the chamber body; and
   a shower head assembly disposed above the substrate support assembly within the chamber body, wherein the showerhead assembly comprises:
      an underplate partitioning multiple zones, wherein each zone has a plurality of apertures that are configured to pass a first gas through the underplate into a first plenum, wherein the first gas mixes with a second gas in the first plenum;
      a diffuser plate disposed adjacent the underplate, wherein the first plenum is defined between the underplate and the diffuser plate, and wherein the diffuser plate comprises a plurality of apertures configured to pass the first gas mixed with the second gas from the first plenum to a second plenum; and
      a faceplate having a first side and a second side, the first side of the faceplate being disposed adjacent to the diffuser plate, wherein the second plenum is defined between the diffuser plate and the first side of the faceplate, and wherein the faceplate has a plurality of apertures configured to deliver the first gas mixed with the second gas from the second plenum to the second side.

8. The processing chamber of claim 7, wherein the shower head assembly further comprises a flow ratio control device coupled to the multiple zones through a plurality of gas lines, the flow ratio device comprising:
   a first gas source coupled to each gas line of the plurality of gas lines, the first gas source configured to provide the first gas to each zone;
   a plurality of valves, each valve being coupled to a gas line of the plurality of gas lines, wherein each valve is configured to open and close a respective gas line of the plurality of gas lines; and
   a plurality of orifices, each orifice being coupled to a gas line of the plurality of gas lines, wherein each orifice is configured to control a flow rate of the first gas through a respective gas line of the plurality of gas lines.

9. The processing chamber of claim 8, wherein one or more orifices of the plurality of orifices have different sizes to provide different amounts of gas flow to one or more zones of the multiple zones.

10. The processing chamber of claim 7, wherein the shower head assembly further comprises:

a central conduit extending through the underplate to the first plenum, wherein the central conduit is configured to provide the second gas to the first plenum; and a second gas source configured to provide the second gas to the first plenum.

11. The processing chamber of claim 7, wherein each zone is provided with a different concentration of the first gas.

12. The processing chamber of claim 7, wherein the plurality of zones formed in the underplate corresponds to a plurality of zones in the faceplate.

13. The processing chamber of claim 7, wherein the second side of the faceplate is disposed adjacent to the substrate support assembly.

* * * * *